United States Patent [19]

Mine et al.

[11] Patent Number: 5,036,024
[45] Date of Patent: Jul. 30, 1991

[54] METHOD OF TREATING A HARDENED SEMICONDUCTOR RESIN ENCAPSULATED LAYER WITH ULTRAVIOLET RADIATION

[75] Inventors: Katsutoshi Mine, Ichihara; Akemi Kogo, Chiba; Kimio Yamakawa; Kazumi Nakayoshi, both of Ichihara, all of Japan

[73] Assignee: Toray Silicone Company, Inc., Tokyo, Japan

[21] Appl. No.: 580,054

[22] Filed: Sep. 10, 1990

Related U.S. Application Data

[62] Division of Ser. No. 223,060, Jul. 22, 1988.

Foreign Application Priority Data

Jul. 22, 1987 [JP]  Japan .................. 62-183974

[51] Int. Cl.$^5$ ............................................ H01L 21/56
[52] U.S. Cl. ............................... 437/211; 357/72
[58] Field of Search ............ 357/72, 74; 437/211, 437/219

[56] References Cited

U.S. PATENT DOCUMENTS

| | | | |
|---|---|---|---|
| 4,523,371 | 6/1985 | Wakashima | 29/588 |
| 4,707,725 | 11/1987 | Ito | 357/72 |
| 4,758,875 | 7/1988 | Fujisaki et al. | 357/72 |

FOREIGN PATENT DOCUMENTS

| | | |
|---|---|---|
| 124624 | 11/1983 | European Pat. Off. |
| 210442 | 6/1986 | European Pat. Off. |
| 48429 | 3/1983 | Japan |
| 84449 | 5/1983 | Japan |
| 33841 | 2/1984 | Japan |
| 188947 | 10/1984 | Japan |
| 60-741 | 4/1985 | Japan |
| 69538 | 3/1987 | Japan |

Primary Examiner—Olik Chaudhuri
Assistant Examiner—David E. Graybill
Attorney, Agent, or Firm—Roger H. Borrousch

[57] ABSTRACT

Semiconductor devices which comprise a semiconductor chip, electrically conductive materials for connections to external leads, and encapsulated by a sealing resin has a surface and a portion of the electrically conductive material covered with a hardened silicone layer whose surface is exposed to ultraviolet radiation and the irradiation processed surface adheres to and is unified with the sealing resin. The sealing resin does not break easily when the device is exposed to heat cycles, thermal shock, repeated interruptions in current flow, and long periods of time at high temperature or low temperature. Such devices also exhibit excellent properties of moisture resistance, corrosion resistance and stress relaxation.

4 Claims, 3 Drawing Sheets

METHOD OF TREATING A HARDENED SEMICONDUCTOR RESIN ENCAPSULATED LAYER WITH ULTRAVIOLET RADIATION

This is a divisional of copending application Ser. No. 07/223,060 filed on 7/22/88.

BACKGROUND OF THE INVENTION

1. Field of the Invention

The present invention relates to a resin-sealed semiconductor device. Specifically, it relates to a resin-sealed semiconductor device whereby a semiconductor chip is electrically connected to leads for external connections by means of electrically conductive materials.

2. Conventional Technology

In resin-sealed semiconductor devices where semiconductor chips are connected electrically to leads for external connections by electrically conductive materials, the semiconductor chip surface PN connectors, MOS gates, bonding pads, and fine aluminum wires, as well as such electrically conductive material as bonding wires, solder bumps, and beam leads have been coated with a hardened silicone layer such as high-purity silicone resin, silicone rubber, or silicone gel, in order to prevent degeneration and corrosion and to moderate mechanical stress and stress due to expansion and contraction accompanying temperature changes in the sealing resin. A coating of sealing resin is then applied over the coating formed by the hardened silicone layer. FIG. 4 shows a cross-sectional diagram of this type of conventional resin-sealed semiconductor device. A portion of the bonding pad (3) and the gold bonding wires (4) are coated with a liquid hardenable silicone rubber composition. This is thermally hardened to form a silicone rubber layer (5). A sealing resin such as the epoxy resin (6) is then used to form a seal over this silicone rubber layer, the remainder of the bonding wires (4), and the inner portion of the lead wires for external connections (7).

PROBLEMS WITH CONVENTIONAL TECHNOLOGY

With this type of resin-sealed semiconductor device, the hardened silicone layer is generally comparatively thick, 100 to 500 micrometers. In other words, a portion of gold bonding wire (4) is also buried within the silicone rubber layer (5). Thus, these bonding wires (4) may break when the coating is being formed on the silicone-coated monolithic IC chip (1), the bonding wires (4), and the inner portion of the lead wires for external connections (7), or when the seal-formed products undergo thermal cycle testing and thermal shock testing. This is a problem.

When seal-formed products are installed on the surface of a printed circuit board, they undergo the thermal shock of being immersed in a solder bath at 260° C. and then lifted out and cooled, which may also cause such problems as breakage of the gold bonding wires (4) as well as cracking of the sealing epoxy resin (6), leading to deterioration of the moisture-resistant properties of the semiconductor device. These problems occur because the silicone which forms the hardened silicone layer has not been modified sufficiently for these applications, so that there is insufficient adhesion and unification between the sealing epoxy resin (6) and the silicone rubber layer (5). As a result, during thermal cycle testing and thermal shock testing, or when undergoing thermal shock during installation on the printed circuit board, the sealing epoxy resin (6) and the silicone layer (5) undergo rapid expansion and shrinking, and movement occurs at the interface between the two materials due to differences in their coefficients of thermal expansion. Moisture enters into the microscopic spaces thus formed between the sealing epoxy resin (6) and the silicon rubber layer (5).

European Patent Publication No. 124,624, published Nov. 14, 1984, Mine et al which is equivalent to Japanese Patent Application Laid Open (Kokai) No. 59-87,840, published May 21, 1984, and European Patent Publication No. 210,442, published Feb. 4, 1987, Ryuzo which is equivalent to Japanese Patent Application Laid Open (Kokai) No. 61-230,344, published Oct. 14, 1986 were proposed to resolve these problems, but the solutions they provided were inadequate.

SUMMARY OF THE INVENTION

The present invention was developed to completely resolve the problems encountered with conventional technology. Specifically, this invention relates to a resin-sealed semiconductor device which shows excellent properties of moisture resistance, corrosion resistance, and stress relaxation, in which bonding wires are not readily broken or damaged by repeated heat cycles and thermal shock, repeated interruptions in current flow, or long-term applications of heat or pressure. The present invention also relates to a method of manufacturing this device.

These objectives are achieved by means of a resin-sealed semiconductor device characterized by the fact that a semiconductor chip is electrically connected to lead wires for external connections by means of electrically conductive materials, the surface of said chip and at least the portions of electrically conductive material in proximity to said semiconductor chip are covered with a hardened silicon layer to which the resin-sealed semiconductor device is attached, and the surface of said hardened silicone layer having undergone ultraviolet irradiation processing, such that the ultraviolet-irradiation-processed hardened silicone layer surface adheres to and is unified with the sealing resin with which it is covered.

The objectives are also achieved by a method of manufacturing a resin sealed semiconductor devices characterized by the fact that at least one semiconductor chip of a semiconductor device is electrically connected to lead wires for external connections by means of electrically conductive materials, the surface of said chip and at least the portions of said electrically conductive material in proximity to said semiconductor chip are covered with a hardenable self-bonding silicone composition which is hardened forming a hardened silicone layer adhered to said semiconductor chip surface and at least the portions of said electrically conductive materials in proximity to said semiconductor chip, and ultraviolet irradiation processing said hardened silicone layer, then forming a characteristic seal by covering the hardened silicone layer with sealing resin such that the resin-sealed semiconductor device adheres to and covers the hardened silicone layer of said semiconductor chip surface and at least the portions of the electrical conducting materials in proximity to said semiconductor chip, and the surface of said hardened silicone layer after undergoing ultraviolet irradiation processing adheres to and is unified with the sealing resin by which it is covered.

The objectives are further achieved by a method of manufacturing a resin-sealed semiconductor device characterized by the fact that at least one semiconductor chip of the semiconductor device is electrically connected to external lead wires by means of electrically conductive materials, the surface of said chip and at least the portions of said electrically conductive materials in proximity to said semiconductor chip are covered with a thermally hardenable self-bonding silicone composition, said thermally hardenable self-bonding silicone composition is hardened by means of ultraviolet irradiation forming a hardened silicone layer adhered to said semiconductor chip surface and at least the portions of said electrically conductive materials in proximity to said semiconductor chip, and then forming a characteristic seal by covering said ultraviolet-irradiation-processed hardened silicone layer with a sealing-resin such that it covers the hardened silicone layer and adheres to its surface and the surface of said hardened silicone layer after undergoing ultraviolet irradiation processing adheres to and is unified with the sealing resin by which it is covered.

LIST OF REFERENCE NUMBERS WITH DEFINITIONS

Figure 1:
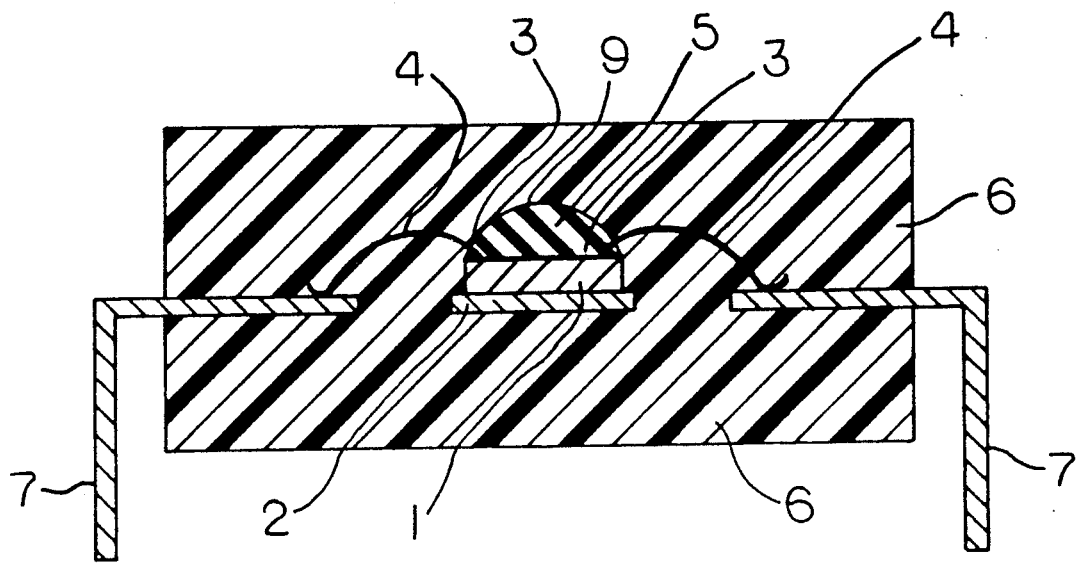
FIG. 1 is a cross-section of a resin-sealed IC, illustrating a practical example of the present invention.

1 ... Monolithic IC chip
2 ... Tab
3 ... Bonding pad
4 ... Gold bonding wire
5 ... Silicone rubber layer
6 ... Sealing epoxy resin
7 ... Lead wire for external connections
8 ... Ceramic substrate
9 ... Ultraviolet-irradiation-processed surface
14 ... Aluminum bonding wire
15 ... Silicone resin layer
16 ... Sealing phenol resin

DESCRIPTION OF THE PREFERRED EMBODIMENTS

In explanation, the term "semiconductor device" in the present invention is broadly defined, including not only independent semiconductor devices such as diodes, transistors, and thyristors, but also such IC units as monolithic ICs and hybrid ICs as well as LSI. "Semiconductor chip" refers to a chip making up a major part of the above mentioned semiconductor device, and includes diode chips, transistor chips, thyristor chips, monolithic IC chips, and hybrid IC chips. The "electrically conductive material" electrically connects the semiconductor chip to the external connecting lead wires. Typical examples include bonding wires made from aluminum, gold, and copper, with solder bumps in flip-type semiconductor devices and beam leads in beam-lead-type semiconductor devices. The electrically conductive material is normally connected to the inner portion of the external connecting lead wire, but in hybrid ICs may also be connected to the inner portion through thick-film circuits and thin-film circuits on the board.

The "sealing resin" can be any organic resin which will not have a negative influence on semiconductor performance or reliability. This category includes heat-moldable resins of which polyphenylene sulfide is representative, and thermally hardenable resins of which epoxy resin, silicone resin, and phenolic resins are representative. Before sealing, the resin can be in liquid form, paste form, solid form, powder form, etc. at room temperature. In addition to the resin, the composition frequently contains fillers and/or additives, and thermally hardenable resins contain hardening agent, in addition to fillers.

The hardened silicone layer is made up of a hardenable silicone composition which can be hardened by one or a combination of procedures such as standing at room temperature, heating, infrared irradiation, and electron beam irradiation. Before hardening, the composition at room temperature may be in the form of a liquid, paste, sticky solid, powder, or solid. The hardened silicone layer at room temperature can be in the solid resin state, the rubber state, the gel state, or some intermediate state.

The hardened silicone layer adheres to the semiconductor chip surface and to at least the portions of the electrically conductive material in proximity to the semiconductor chip, coating the semiconductor chip surface and at least the portions of the electrically conductive material in proximity to the semiconductor chip, while simultaneously the ultraviolet-irradiation-processed hardened silicone layer adheres to and is unified with the sealing resin which covers it. Here, "adhesion to and unification with" means that even under thermal stress and mechanical stress loads there is no separation between the surfaces of the hardened silicone layer and the sealing resin layer. This adhesion is so strong that one of the layers will be destroyed if forcible separation of the hardened silicone layer from the sealing resin is attempted, which is termed "cohesive adhesion."

Typical examples of the hardenable silicone compositions which can be used to form the hardened silicone layer include: (1) silicone hardenable compositions containing silicon-atom-bonded hydrogen atoms and organopolysiloxanes containing vinyl group and containing silicon-bonded hydrogen atoms in the hardened state; (2) silicone hardenable compositions containing silicon-atom-bonded hydrolyzable groups and containing silicon-bonded hydrolyzable groups in the hardened state; and (3) silicone hardenable compositions containing silicon-atom-bonded hydrogen atoms and silicon-atom-bonded hydrolyzable groups and containing silicon-bonded hydrogen atoms and silicon-bonded hydrolyzable groups in the hardened state.

Class (1) silicone hardenable compositions comprise hardenable self-bonding silicone compositions of organopolysiloxane containing vinyl groups, organohydrogen polysiloxane, and platinum compound catalyst as main reagents, in a composition ratio such that the silicon-atom-bonded hydrogen atoms are present in considerable excess over the silicon-atom-bonded vinyl groups. These compositions can be hardened by mixing the ingredients at ambient conditions or if certain platinum catalyst inhibitors are present, by heating.

Class (2) silicone hardened compositions comprise hardenable self-bonding silicone compositions of organopolysiloxane containing vinyl groups, organohydrogen polysiloxane, a reactive adhesion promoting agent for example, vinyl trialkoxysilane, aryl trialkoxysilane, or gamma-methacryloxypropyl trialkoxysilane, and a platinum catalyst as the main ingredients.

Class (3) silicone hardenable compositions comprise, hardenable self-bonding silicone compositions of organopolysiloxane containing vinyl group, organohydrogen polysiloxane, a reactive adhesion promoting agent for example, vinyl trialkoxy silane, aryl trialkoxy silane, or gamma-methacryloxypropyl trialkoxy silane and a platinum catalyst as the main ingredients, in a composition ratio such that the silicon-atom-bonded hydrogen atoms are present in considerable excess over the silicon-atom-bonded vinyl groups. These compositions can be hardened by mixing the ingredients at ambient conditions. Preferred hardenable self-bonding silicone compositions are addition-reaction-hardenable compositions such as mentioned above, and among these the thermally hardenable compositions are preferable. However, organic peroxide radical-reaction-hardenable types and reduction-reaction-hardenable types are also acceptable.

Hardenable silicone compositions may contain addition-reaction extenders, reinforcing fillers, volume-increasing fillers, heat-resistant agents, pigments, etc. content of substances which have a negative influence on semiconductor performance, especially alkali metals and halogen ions, should be held to 1 ppm or less, while to prevent alpha-ray-induced soft errors which come from radioactive elements, the total content of such radioactive elements such as uranium and thorium should be held to 0.1 ppb or less.

The hardened silicone layer covers functional portions of the surface of the semiconductor chips, including PN connectors, MOS gates, aluminum wires, and bonding pads, as well as at least such portions of the electrically conductive materials, such as bonding wires, solder bumps, beam leads, etc. in proximity with the semiconductor chips. In addition, sides of the semiconductor chips, remaining portions of the electrically conductive materials, and portions other than the semiconductor chips and the electrically conductive materials in the hybrid IC, for example, film circuits, resisters, and condensers, can be coated as necessary. It is desirable to have non-functional portions of the semiconductor chip sides also covered with a hardened silicone layer. The thickness of the hardened silicone layer should be sufficient to adequately cover the semiconductor chip surface and the portions of the electrically conductive material in proximity to said semiconductor chip, with a thickness of several micrometers or preferably above. Thicknesses of approximately 10 to 500 micrometers are usual, with a thickness of several millimeters acceptable in extreme cases.

The ultraviolet irradiation processing of the surface of the hardened silicone layer is a very important constitutional element in the present invention, and is extremely important in ensuring the adhesion and unification of the sealing resin with said hardened silicone layer. The ultraviolet used in the present invention is ordinary high-intensity ultraviolet. Sources include, for example, ultra-high-voltage mercury lamps, high-voltage mercury lamps, low-voltage mercury lamps, and xenon mercury lamps. The amount of ultraviolet radiation required varies depending on the properties of the harden silicone layer, but generally when using an ultraviolet lamp with 100 to 3000 W of power, approximately 1 to 300 seconds of irradiation is sufficient, with 10 to 120 seconds of irradiation being preferable. The longer times are usually used with the lower power ultraviolet sources.

When the hardened silicone layer of the present invention is formed from a thermally hardenable self-bonding silicone composition, the surface of the semiconductor chip and at least the portions of the electrically conductive component materials which are in proximity to the semiconductor chips are coated with said thermally hardenable self-bonding silicone composition, so that heat may be applied and said coated surfaces can be exposed to ultraviolet radiation. The heating may come from a usual heat source, or may come from the lamp which is used as the source of ultraviolet radiation.

To manufacture the resin-sealed semiconductor device of the present invention, for example, the surface of the semiconductor chip and at least the portions of the electrically conductive materials in proximity to the semiconductor chips can be coated with the hardenable self-bonding silicone composition, and after this has hardened the surface of the hardened silicone layer is exposed to ultraviolet radiation, or ultraviolet radiation can be carried out while hardening is under way. In this case, it is preferable if the hardenable self-bonding silicone composition is thermally hardenable, and it is even more preferable if the composition is also addition-reaction-hardenable. It is also preferable if the hardening is thermal hardening, and then the above semiconductor device is seal-molded with a sealing resin, such as a sealing epoxy resin by wrapping around the inner portions of the wires for external connections, the electrically conducting materials, and the semiconductor chips. The coating of hardenable self-bonding silicone composition may be applied by methods such as dripping, painting, spraying, and immersion, while the sealing resin seal can be formed by such means as transfer molding, injection molding, powder application, and in situ potting. The resin-sealed semiconductor devices of the present invention can be used in such applications as computers, televisions, video cassette recorders, and automatically controlled machines.

PRACTICAL EXAMPLES

Next, we will present practical examples of the present invention and comparative examples involving conventional technology. In the following, "parts" refers to "parts by weight." Viscosity values are at 25° C. Heat-cycle testing was carried out continuously between a minimum temperature of −65° C. and a maximum temperature of 180° C., with 1 cycle requiring 3 hours. For thermal shock testing, samples were held first at −50° C. for 30 minutes and then at 150° C. for 30 minutes, repeatedly. Thermal fatigue testing was carried out by repeatedly interrupting the flow of current.

PRACTICAL EXAMPLE 1

FIG. 1 is a cross-sectional diagram of a wire bonding type resin-sealed IC, a practical example of the present invention. Onto the surface of the monolithic IC chip (1) placed on the tab (2) and on the portions of the gold bonding wires (4) in proximity to said chip (1) was dripped an addition-reaction-hardenable silicone rubber composition having a 2:1 molar ratio between silicon-atom-bonded hydrogen atoms and vinyl groups of the (a) component described below. This silicone rubber composition was composed of:

(a) 100 parts of a copolymer of dimethylsiloxane units and methylphenylsiloxane units having terminal dimethylvinylsiloxy units at both ends of the molecular chain (viscosity 2.0 Pa.s)

(b) 3.0 parts of a methylhydrogen polysiloxane having terminal trimethylsiloxy units at both ends of the molecular chain (viscosity 0.02 Pa.s)

(c) 2.0 parts of aryl trimethoxysilane, and (d) sufficient complex of chloroplatinic acid and divinyl tetramethyl disiloxane to produce a platinum atom content in the entire composition of 5.0 ppm.

After this composition was dripped, it was hardened by heating at 100° C. for 10 minutes, after which the hardened silicone rubber layer was placed 6 cm from a 3000 W ultra-high-voltage mercury lamp. Ultraviolet irradiation was carried out for 60 seconds. Next, a seal was formed on the remaining portions of the gold bonding wires (4) and the inner portions of the external lead wires (7), as well as on this silicone-rubber-coated portion, using a commercially available sealing epoxy resin (6).

The silicone rubber layer (5), which resulted from the hardening of the above mentioned silicone rubber composition, coated the surface of the monolithic IC chip (1) and the portions of the gold bonding wires (4) in proximity to said IC chip (1), forming an adhesive state, and also adhered strongly to and was unified with the sealing epoxy resin (6) covering the surface (9) which had undergone ultraviolet irradiation processing. This resin-sealed IC showed no breakage of the gold bonding wires (4) even after 2500 cycles of heat cycle testing, and no breakage of the gold bonding wires (4) even after 800 cycles of thermal shock testing. Electrical characteristics were measured for semiconductor devices of the present invention after 700 hours of PCT (121° C., 2 atmospheres pressure), with no irregularities observed in the aluminum wire circuits, etc., on the semiconductor chip surface.

COMPARATIVE EXAMPLE 1

Figure 4:
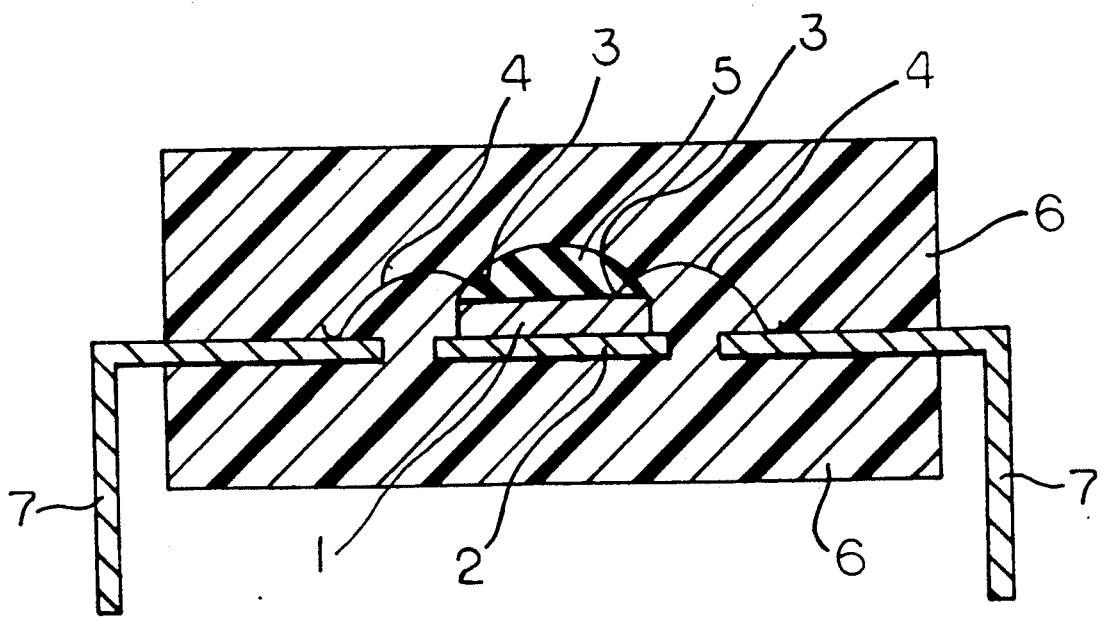
FIG. 4 is a cross-sectional diagram of an example of a conventional resin-sealed IC.

FIG. 4 is a cross-sectional diagram of an example of a conventional wire bonding type resin-sealed IC. On the surface of the monolithic IC chip (1) positioned on the tab (2) and the portions of the gold bonding wires (4) in proximity to the chip was dripped a conventional addition-reaction-hardenable silicone rubber composition constituted of 100 parts of the (a) component from Practical Example 1, 3.0 parts of the (b) component, and just enough of the (d) component to provide a platinum atom concentration of 5.0 ppm throughout the entire composition. The resulting coated composition underwent thermal hardening at 100° C. for 10 minutes, after which it was coated along with the remainder of the gold bonding wires (4) and the inner portions of the external lead wires (7), using a commercially available sealing epoxy resin (6).

The silicone rubber layer (5) resulting from the hardening of the above mentioned silicone rubber composition coated the monolithic IC chip (1) surface and the portions of the gold bonding wires (4) in proximity to said IC chip (1), forming a state of marginal adhesion. The coating appeared to be in close contact with the sealing epoxy resin (6) covering it, but microscopic examination revealed the presence of micro-interstices between these surfaces, with no true adhesion.

When this resin-sealed IC was subjected to heat cycle testing, breakage of the gold bonding wires (4) was observed after 200 cycles. During thermal shock testing, breakage of these gold bonding wires (4) occurred after 20 cycles.

When electrical characteristics of this device were measured after 100 hours of PCT (121° C., 2 atmospheres pressure), inadequacies in conductivity were noted. Failures were analyzed by removing and analyzing the sealing epoxy resin (6) and the silicone layer (5), whereupon researchers noted corrosion on portions of the aluminum wire circuits and the aluminum bonding pads (3).

PRACTICAL EXAMPLE 2

Figure 2:
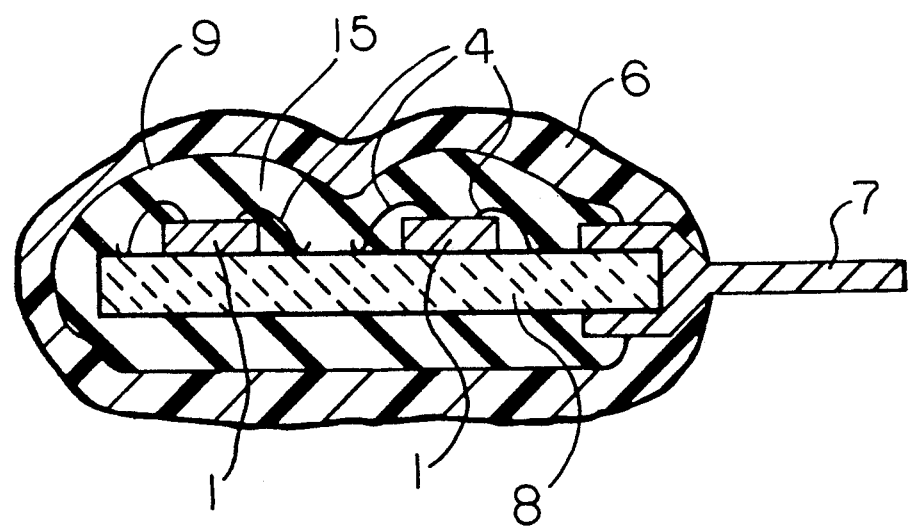
FIG. 2 is a cross-section of an SIP hybrid IC sealed with powdered epoxy resin, another practical example of the present invention.

FIG. 2 is a cross-section of an SIP-type hybrid IC sealed with powdered epoxy resin. This is another practical example of the present invention. Monolithic IC chips (1) were mounted on the ceramic substrate (8), and were electrically connected to the external lead wire (7) by means of the gold bonding wires (4) and the aluminum film circuit (not shown) printed on the circuit board. This hybrid IC was immersed in an addition-reaction-hardenable silicone resin composition having a molar ratio of 5:1 between silicon-atom-bonded hydrogen atoms and the vinyl groups of the (a) constituent described below consisting of:

(a) 100 parts silicone resin made up of 8.0 mol % dimethylvinyl siloxane units, 12 mol % dimethylsiloxane units, and 80 mol % SiO 4/2 units (b) 6.0 parts methylhydrogen polysiloxane having terminal trimethylsiloxy units at both ends of the molecular chain (viscosity 0.02 Pa.s)

(c) Sufficient complex of chloroplatinic acid and divinyl tetramethyl disiloxane to produce a platinum atom concentration in the total composition of 5.0 ppm, and was then lifted out and hardened for 5 minutes at 120° C. Next, the unit was placed so that the hardened silicone layer was separated by 3 cm from a 500 W high-voltage mercury lamp, and and ultraviolet irradiation was carried out for 120 seconds. Following this, a seal was formed using a commercially available powdered epoxy resin.

The silicone resin layer (15) resulting from the hardening of the above mentioned silicone resin composition adhered to and covered the top and side surfaces of the monolithic IC chips (1) mounted on the ceramic substrate (8), the gold bonding wires (4), the remainder of the ceramic substrate (8), and the inner portion of the external lead wire (7). It adhered tightly to and was unified with the sealing epoxy resin (6) which coated the ultraviolet-irradiation-processed surface (9). After 100 hours of PCT (121° C., 2 atmospheres pressure), the electrical characteristics of this resin-sealed hybrid IC were measured, with no change observed from the initial current leakage value of 1 microamp. Identical results were obtained following 250 hours of PCT (121° C., 2 atmospheres pressure). There was no corrosion or breakage in the aluminum wire circuits on the surface of the monolithic IC chip (1), either following 100 hours of PCT or 350 hours of PCT.

COMPARATIVE EXAMPLE 2

Figure 5:
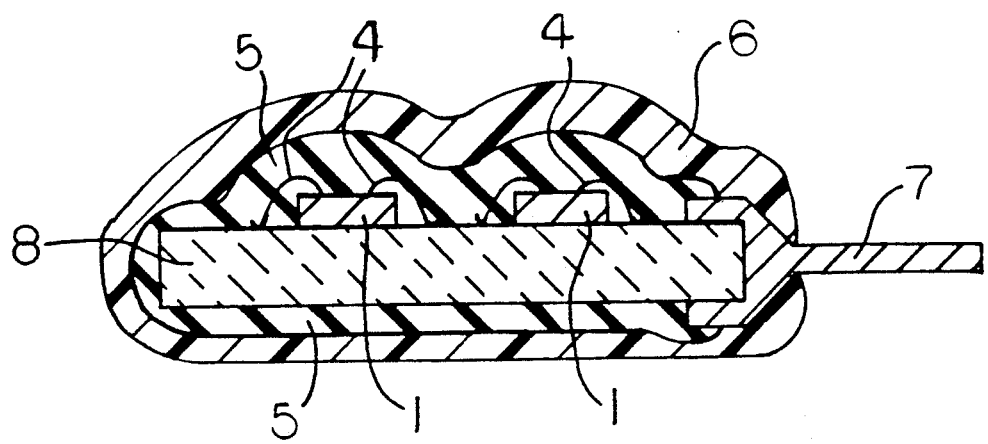
FIG. 5 is a cross-sectional diagram of a conventional SIP hybrid IC sealed with powdered epoxy resin.
Figure 6:
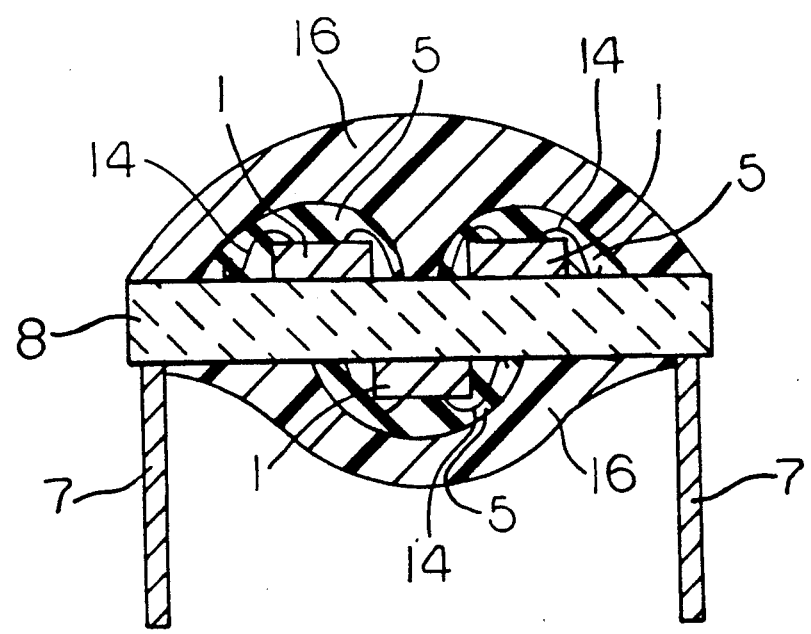
FIG. 6 is a cross-sectional diagram of an example of a DIP hybrid IC sealed with liquid phenol resin.

FIG. 5 shows a cross-section of one example of a conventional SIP-type hybrid IC sealed with powdered epoxy resin.

Monolithic IC chips (1) were mounted on the ceramic substrate (8), and said IC chips (1) were electrically connected to the external lead wire (7) by means of the gold bonding wires (4) and the aluminum film circuit (not shown) printed on said substrate. The hybrid IC electrically connected to the external lead wire (7) was immersed in an addition-reaction-hardenable silicone resin composition having a molar ratio of 1:1 between the silicone-bonded-hydrogen atoms and the vinyl groups of the (a) constituent described below made up of 100 parts of the (a) constituent as used in Practical Example 2, 1.2 parts of that (b) constituent, and sufficient (c) constituent to provide a platinum atom concentration in the total composition of 5.0 ppm. The resulting hybrid IC was then lifted out and hardened for 5 minutes at 120° C., after which a seal was formed of commercially available epoxy resin.

The silicone resin layer (15) resulting from the hardening of the above mentioned silicone resin composition covered the top and sides of the monolithic IC chips (1) on the ceramic substrate (8), the gold bonding wires (4), the remainder of the ceramic substrate, and the inner portion of the external lead wire (7), forming a state of marginal adhesion. It appeared to adhere closely to the sealing epoxy resin (6) which covered it, but examination by microscope revealed the presence of micro-interstices between these surfaces, with no adhesion.

When electrical characteristics of this resin-sealed hybrid IC were measured after 100 hours of PCT (121° C., 2 atmospheres pressure), a great increase in current leakage, 100 microamps and above, was observed. Corrosion and breakage also occurred in portions of the aluminum wire circuits on the surface of the monolithic IC chips.

PRACTICAL EXAMPLE 3

Figure 3:
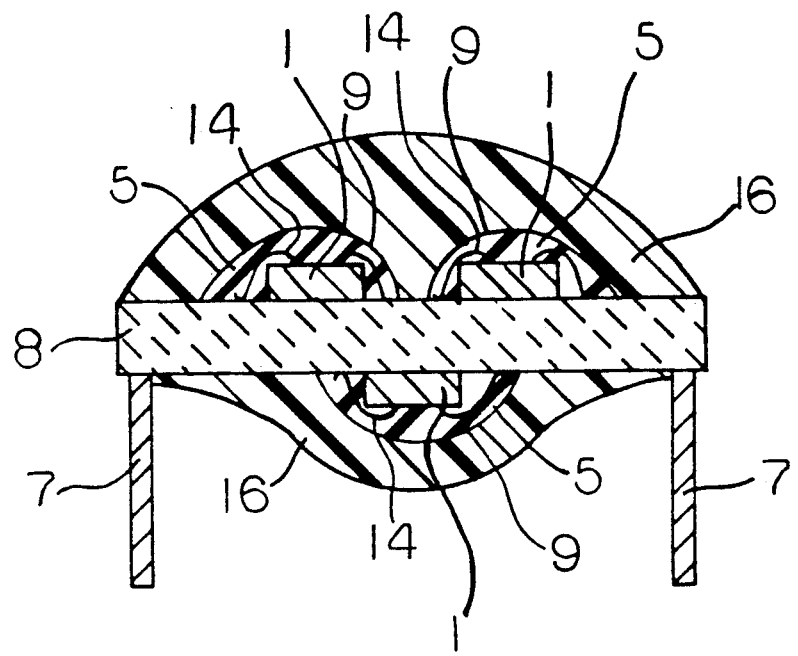
FIG. 3 shows a cross-section of a DIP hybrid IC sealed with liquid phenol IC resin, yet another practical example of the present invention.

FIG. 3 is a cross-sectional diagram of a DIP-type hybrid IC sealed with liquid phenolIC resin. This is another practical example of the present invention.

Monolithic IC chips (1) were mounted on both sides of a ceramic substrate (8), and said IC chips were electrically connected to the external lead wires by means of the aluminum bonding wires (14) and the aluminum film circuit (not shown) printed on said substrate. Onto said IC chips (1) and aluminum bonding wires (14) was dripped an addition-reaction-hardenable silicone rubber composition having a molar ratio of 4:1 between the silicon-atom-bonded hydrogen atoms and the vinyl groups of the (a) constituent described below consisting of (a) 100 parts of polydimethylsiloxane having terminal dimethyl vinylsiloxy units on both ends of the molecular chain (viscosity 4.0 Pa.s), (b) 0.5 part of methylhydrogen polysiloxane having terminal trimethylsiloxy units on both ends of the molecular chain (viscosity 0.02 Pa.s), (c) Sufficient complex divinyltetramethyldisiloxane of chloroplatinic acid to provide a platinum atom concentration in the total composition of 5.0 ppm, and (d) 2.0 parts of gamma-methacryloxypropyltrimethoxysilane.

The coated product was then hardened at 150° C. for 1 minute, after which the hardenable silicone rubber layer was positioned a distance of 10 cm from a 1500 W ultra-high-voltage mercury lamp, and ultraviolet irradiation was carried out for 120 seconds. Next, a seal of commercially available liquid phenolic resin for sealing applications was formed over the silicone-rubber-coated portions and a portion of the external lead wires (7).

The silicone rubber layer (5) resulting from the hardening of the aforementioned silicone rubber composition adhered to and formed a coating over the monolithic IC chips (1) on the ceramic substrate (8), the aluminum bonding wires (14), and a portion of the external lead wires (7) and both surfaces of the ceramic substrate in proximity to said IC chips (1), and adhered strongly to and was unified with the sealing phenolic resin (16) which coated the ultraviolet-irradiation-processed surface (9).

The silicone rubber layer (5) formed by hardening the above mentioned silicone rubber composition covered the surface of the monolithic IC chips (1) on the ceramic substrate (8), the aluminum bonding wires (14), and the areas in proximity to said IC chips (1) on both sides of the ceramic substrate (8), forming a state of marginal adhesion state. It appeared to adhere closely to the sealing phenolic resin (16) which covered it, but examination by microscope revealed the presence of micro-interstices between these surfaces, with no adhesion.

When electrical characteristics of this resin-sealed hybrid IC were measured after 150 hours of PCT (121° C., 2 atmospheres pressure), a great increase in current leakage was observed, to 100 microamps and above. Corrosion and breakage also occurred in portions of the aluminum bonding wires (14) and the aluminum wire circuits on the surface of the monolithic IC chips (1).

EFFECTS OF THE PRESENT INVENTION

In the resin-sealed semiconductor devices of the present invention, the hardened silicone layer adheres to and covers the surface of the semiconductor chip and at least the portions of the electrically conductive component materials in proximity to said chip. At the same time, it adheres to and is unified with the sealing resin which covers the ultraviolet-irradiation-processed surface of said hardened silicone layer. Electrically conductive materials such as bonding wires do not break or undergo damage readily, even when exposed to repeated heat cycles and thermal stress, repeated interruptions of current flow, or long periods of high temperature and high pressure. The sealing resin does not break easily, and the product characteristically shows excellent properties of moisture resistance, corrosion resistance, and stress relief.

A method of manufacturing resin-sealed semiconductor devices of the present invention efficiently produces resin-sealed semiconductor devices characterized by the fact that the surface of the semiconductor chip and at least the portions of the electrically conductive material in proximity to the semiconductor chips are coated with a hardenable self-bonding silicone composition, this layer is hardened and then exposed to ultraviolet radiation, and a covering seal is then formed using a sealing resin. This hardened silicone layer adheres to and covers the surface of the semiconductor chip and at least the portions of the electrically conductive materials in proximity to said chip, while at the same time adhering to and becoming unified with the sealing resin with which it is covered.

A method of manufacturing resin-sealed semiconductor devices of the present invention efficiently produces resin-sealed semiconductor devices characterized by the fact that the surface of the semiconductor chip and at least the portions of the electrically conductive material in proximity to the semiconductor chip are coated with a thermally hardenable self-bonding silicone composition, this layer is thermally hardened and exposed to ultraviolet radiation, and a covering seal is then formed using a sealing resin. This hardened silicone layer adheres to and covers the surface of the semiconductor chip and at least the portions of the electrically conductive materials in proximity to said chip, while at the same time adhering to and becoming unified with the sealing resin which covers it.

That which is claimed is:

1. A method of manufacturing a resin sealed semiconductor device characterized by the fact that at least one semiconductor chip of a semiconductor device is electrically connected to lead wires for external connections by means of electrically conductive connections, covering a surface of said chip and at least a portion of said electrically conductive connections in proximity to said semiconductor chip with a hardenable self-bonding silicone composition, hardening said hardenable self-bonding silicone composition forming a hardened silicone layer being adhered to said semiconductor chip surface and at least the portions of said electrically conductive connections in proximity to said semiconductor chip with said hardening selected from the group consisting of: standing at room temperature, heating infrared irradiation, and electron beam irradiation, irradiating said hardened silicone layer with ultraviolet radiation to form an ultraviolet irradiation processed hardened silicone layer, covering said ultraviolet irradiation processed hardened silicone layer with a sealing resin which adheres to and covers the hardened silicone layer of said semiconductor chip surface and at least the portions of the electrical conducting connections in proximity to said semiconductor chip, and the surface of said ultraviolet irradiation processed hardened silicone layer adheres to and is unified with the sealing resin by which it is covered.

2. The method of manufacture in accordance with claim 1, wherein the hardenable silicone composition is a thermally hardenable and addition-reaction-hardenable silicone composition.

3. A method of manufacturing a resin-sealed semiconductor device characterized by the fact that at least one semiconductor chip of the semiconductor device is electrically connected to external lead wires by means of electrically conductive connections, covering a surface of said chip and at least a portion of said electrically conductive connections in proximity to said semiconductor chip with a thermally hardenable self-bonding silicone composition, exposing said thermally hardenable self-bonding silicone composition to ultraviolet radiation forming a hardened silicone layer which adheres to said semiconductor chip surface and at least the portions of said electrically conductive connections in proximity to said semiconductor chips, and with the same process the hardened silicone layer is ultraviolet irradiation processed forming an ultraviolet irradiation processed hardened silicone layer, covering said ultraviolet irradiation processed hardened silicone layer with a sealing resin which adheres to and covers the hardened silicone layer of said semiconductor chip surface and at least the portions of the electrical conducting connections in proximity to said semiconductor chip, and the surface of said ultraviolet irradiation processed hardened silicone layer adheres to and is unified with the sealing resin by which it is covered.

4. The method of manufacture in accordance with claim 3, wherein the thermally hardenable self-bonding silicone composition is an addition-reaction-hardenable composition.

* * * * *